US009869035B2

(12) United States Patent
Yamada et al.

(10) Patent No.: US 9,869,035 B2
(45) Date of Patent: Jan. 16, 2018

(54) VAPOR PHASE GROWTH APPARATUS AND VAPOR PHASE GROWTH METHOD

(71) Applicant: NuFlare Technology, Inc., Kanagawa (JP)

(72) Inventors: Takumi Yamada, Yokohama (JP); Yuusuke Sato, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 94 days.

(21) Appl. No.: 14/968,107

(22) Filed: Dec. 14, 2015

(65) Prior Publication Data

US 2016/0177470 A1 Jun. 23, 2016

(30) Foreign Application Priority Data

Dec. 18, 2014 (JP) .................................. 2014-255808

(51) Int. Cl.
*C30B 25/02* (2006.01)
*C30B 25/14* (2006.01)
(Continued)

(52) U.S. Cl.
CPC .......... *C30B 25/14* (2013.01); *C23C 16/4408* (2013.01); *C23C 16/4412* (2013.01);
(Continued)

(58) Field of Classification Search
CPC .......... C23C 16/00; C23C 16/54; C30B 25/02
See application file for complete search history.

(56) References Cited

U.S. PATENT DOCUMENTS 4,736,705 A * 4/1988 Weyburne ............. C23C 16/301
118/715
5,993,557 A * 11/1999 Tomita ................. C23C 16/4401
118/730
(Continued)

FOREIGN PATENT DOCUMENTS

JP 9-266155 10/1997
JP 2010-225731 10/2010

*Primary Examiner* — Robert M Kunemund
(74) *Attorney, Agent, or Firm* — Rankin, Hill & Clark LLP

(57) ABSTRACT

A vapor phase growth apparatus includes: a reaction chamber; a lower region provided below the reaction chamber; a rotating body provided in the reaction chamber; a rotating shaft connected to the rotating body and having a lower end provided in the lower region; a support portion provided in an upper portion of the rotating body and supporting a substrate; a reaction gas supply port provided on the reaction chamber and supplying a reaction gas for forming a film on the substrate into the reaction chamber; a rotating mechanism including a rotor, the rotating mechanism provided in the lower region and configured to rotate the rotating shaft; a first bearing provided in the lower region and rotatably supporting the rotating shaft; a second bearing provided below the first bearing in the lower region, the second bearing rotatably supporting the rotating shaft; a first air supply port provided above the rotating mechanism and the first bearing in the lower region, the first air supply port supplying a first gas into the lower region; a second air supply port provided below the rotating mechanism and the second bearing in the lower region, the second air supply port supplying a second gas into the lower region; a first exhaust port provided between the first air supply port and the second air supply port in the lower region, the first exhaust port exhausting the first gas and the second gas from the lower region; and a second exhaust port provided in the
(Continued)

reaction chamber and exhausting a surplus reaction gas and a reaction by-product generated by the formation of the film from the reaction chamber.

8 Claims, 2 Drawing Sheets

(51) Int. Cl.
    *C23C 16/44*     (2006.01)
    *C23C 16/455*     (2006.01)
    *C30B 25/16*     (2006.01)
    *C30B 29/40*     (2006.01)
    *C30B 25/12*     (2006.01)
    *C23C 16/458*     (2006.01)

(52) U.S. Cl.
    CPC ........ *C23C 16/455* (2013.01); *C23C 16/4584* (2013.01); *C23C 16/45502* (2013.01); *C23C 16/45521* (2013.01); *C30B 25/12* (2013.01); *C30B 25/165* (2013.01); *C30B 29/403* (2013.01)

(56) References Cited

U.S. PATENT DOCUMENTS

| | | | |
|---|---|---|---|
| 2011/0159188 A1* | 6/2011 | Kato | ............... C23C 16/34 427/255.394 |
| 2013/0074876 A1* | 3/2013 | Akiyama | ........... C23C 16/4405 134/32 |

* cited by examiner

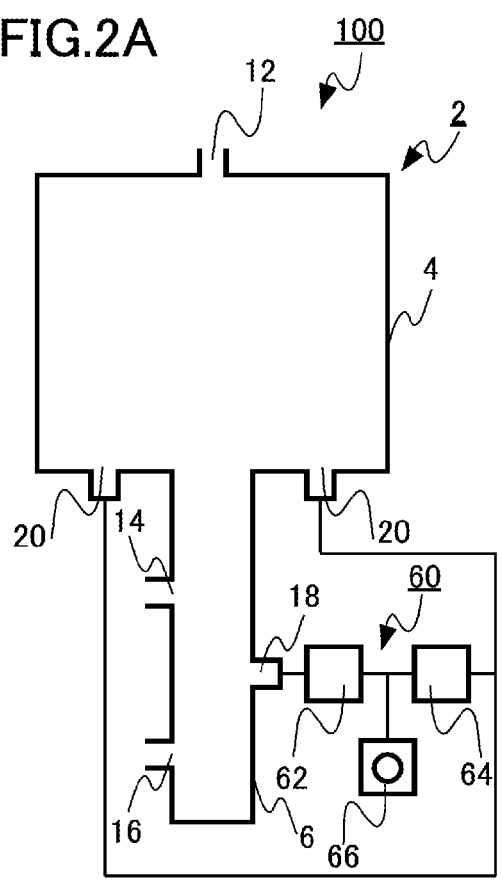
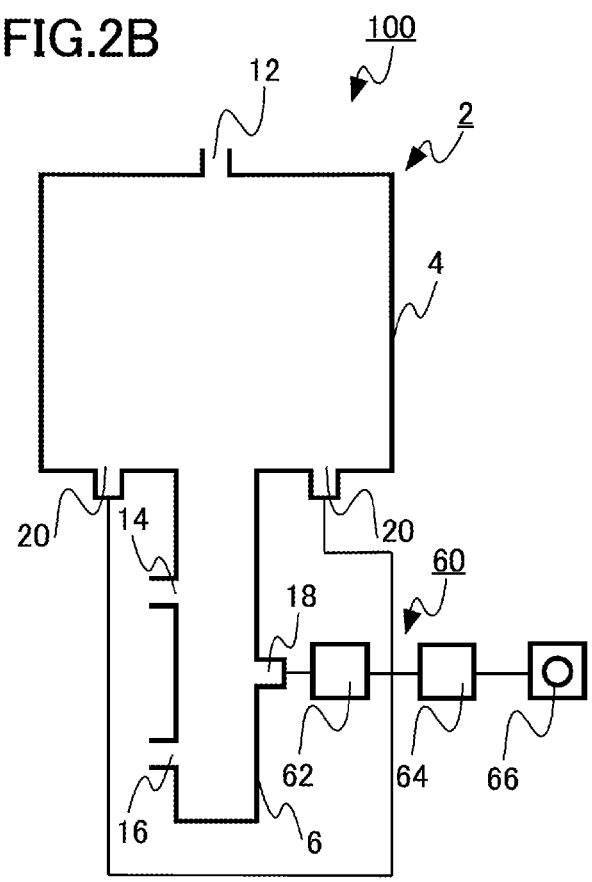

VAPOR PHASE GROWTH APPARATUS AND VAPOR PHASE GROWTH METHOD

CROSS-REFERENCE TO RELATED APPLICATION

This application is based upon and claims the benefit of priority from Japanese Patent Applications No. 2014-255808, filed on Dec. 18, 2014, the entire contents of which are incorporated herein by reference.

FIELD OF THE INVENTION

The present invention relates to a vapor phase growth apparatus and a vapor phase growth method which supply a reaction gas to form a film.

BACKGROUND OF THE INVENTION

As a method for forming a high-quality semiconductor film, there is an epitaxial growth technique which forms a film on a substrate, using vapor phase growth. In a vapor phase growth apparatus using the epitaxial growth technique, a substrate is placed on a support portion in the vapor phase growth apparatus which is maintained at normal pressure or reduced pressure. Then, a reaction gas, which is a raw material, is supplied to the substrate while the substrate is being heated. For example, the thermal reaction of the reaction gas occurs on the surface of the substrate and an epitaxial single-crystal film is formed on the surface of the substrate.

When a film is formed, the support portion is supported by a rotating body and the substrate is rotated by a bearing and a rotating mechanism which support a rotating shaft connected to the rotating body. When a film is formed, there is a concern that contaminants generated from the bearing or the rotating mechanism will be mixed with the film and will prevent a high-quality film from being formed.

SUMMARY OF THE INVENTION

According to an embodiment, a vapor phase growth apparatus includes: a reaction chamber; a lower region provided below the reaction chamber; a rotating body provided in the reaction chamber; a rotating shaft connected to the rotating body and having a lower end provided in the lower region; a support portion provided in an upper portion of the rotating body and supporting a substrate; a reaction gas supply port provided on the reaction chamber and supplying a reaction gas for forming a film on the substrate into the reaction chamber; a rotating mechanism including a rotor, the rotating mechanism provided in the lower region and configured to rotate the rotating shaft; a first bearing provided in the lower region and rotatably supporting the rotating shaft; a second bearing provided below the first bearing in the lower region, the second bearing rotatably supporting the rotating shaft; a first air supply port provided above the rotating mechanism and the first bearing in the lower region, the first air supply port supplying a first gas into the lower region; a second air supply port provided below the rotating mechanism and the second bearing in the lower region, the second air supply port supplying a second gas into the lower region; a first exhaust port provided between the first air supply port and the second air supply port in the lower region, the first exhaust port exhausting the first gas and the second gas from the lower region; and a second exhaust port provided in the reaction chamber and exhausting a surplus reaction gas and a reaction by-product generated by the formation of the film from the reaction chamber.

According to another embodiment, a vapor phase growth method includes: supporting a substrate with a support portion provided in an upper portion of a rotating body provided in a reaction chamber; supplying a reaction gas for forming a film onto the substrate through a reaction gas supply port provided on the reaction chamber; rotating a rotating shaft with a rotating mechanism including a rotor, the rotating shaft being connected to the rotating body, having a lower end provided in a lower region provided below the reaction chamber, and being rotatably supported by a first bearing provided in the lower region and a second bearing provided below the first bearing in the lower region; supplying a first gas into the lower region through a first air supply port provided above the rotating mechanism and the first bearing in the lower region; supplying a second gas into the lower region through a second air supply port provided below the rotating mechanism and the second bearing in the lower region; exhausting the first gas and the second gas from a first exhaust port provided between the first air supply port and the second air supply port in the lower region; and exhausting a surplus reaction gas and a reaction by-product generated by the formation of the film from the reaction chamber.

BRIEF DESCRIPTION OF THE DRAWINGS

FIGS. 2A and 2B are diagrams schematically illustrating the vapor phase growth apparatus according to the embodiment.

DETAILED DESCRIPTION OF THE EMBODIMENTS

Figure 1:
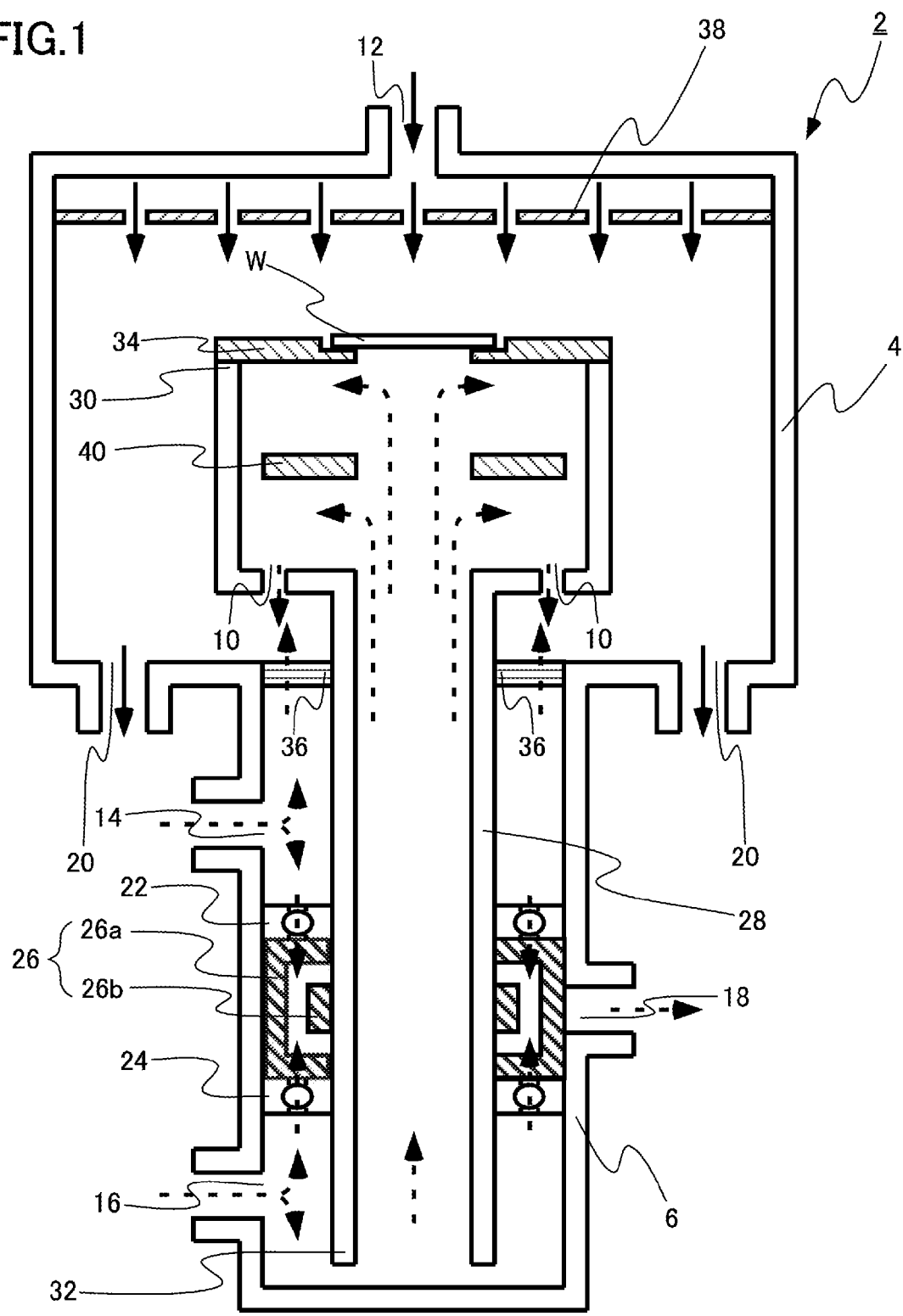
FIG. 1 is a cross-sectional view schematically illustrating a vapor phase growth apparatus according to an embodiment.

Hereinafter, an embodiment of the invention will be described with reference to the drawings.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference.

A vapor phase growth apparatus according to this embodiment includes: a reaction chamber; a lower region provided below the reaction chamber; a rotating body provided in the reaction chamber; a rotating shaft connected to the rotating body and having a lower end provided in the lower region; a support portion provided in an upper portion of the rotating body and supporting a substrate; a reaction gas supply port provided on the reaction chamber and supplying a reaction gas for forming a film on the substrate into the reaction chamber; a rotating mechanism provided in the lower region and rotating the rotating shaft; a first bearing provided in the lower region and rotatably supporting the rotating shaft; a second bearing provided below the first bearing in the lower region, the second bearing rotatably supporting the rotating shaft; a first air supply port provided above the rotating mechanism and the first bearing in the lower region, the first air supply port supplying a first gas into the lower region; a second air supply port provided below the rotating mechanism and the second bearing in the lower region, the second air supply port supplying a second gas into the lower region; a first exhaust port provided between the first air supply port and the second air supply port in the lower region, the first exhaust port exhausting the first gas and the second gas from the lower region; and a second exhaust port provided in the reaction chamber and exhausting a surplus reaction gas and a reaction by-product generated by the formation of the film from the reaction chamber.

FIG. 1 is a cross-sectional view schematically illustrating a vapor phase growth apparatus according to this embodiment. The vapor phase growth apparatus according to this embodiment is a vertical single-wafer-type epitaxial growth apparatus that uses a metal organic chemical vapor deposition (MOCVD) method. The epitaxial growth apparatus according to this embodiment forms group III-V nitride-based semiconductor single-crystal films, such as gallium nitride (GaN), aluminum nitride (AlN), aluminum gallium nitride (AlGaN), and indium gallium nitride (InGaN) single-crystal films.

A vapor phase growth apparatus 2 includes a reaction chamber 4 and a lower region 6 that is provided below the reaction chamber 4. The vapor phase growth apparatus 2 may be formed as follows: the reaction chamber 4 and the lower region 6 are separately molded and the reaction chamber 4 and the lower region 6 are connected so as to be integrated with each other; or the reaction chamber 4 and the lower region 6 are integrally molded.

A rotating body 30 is provided in the reaction chamber 4 and a lower end 32 of a rotating shaft 28 connected to the rotating body 30 is provided in the lower region 6.

A support portion 34 is fixed to an upper portion of the rotating body 30. The support portion 34 horizontally supports a substrate W with respect to the direction of gravity. Here, the support portion 34 has, for example, a concave portion for supporting the substrate W. In addition, a mechanism for supporting the substrate W is not limited to the concave portion. The rotating shaft 28 and the support portion 34 may be integrally molded.

It is preferable that the rotating shaft 28 be a hollow body and an opening portion be provided at the lower end 32 of the rotating shaft, as illustrated in FIG. 1. In addition, it is preferable that a vent hole 10 be provided in the rotating body 30 in the reaction chamber 4. According to this structure, at least one of a first gas and a second gas, which will be described below, flows from a lower side to an upper side in the rotating shaft 28. The gas which flows upward flows from the inside of the rotating shaft 28 and the rotating body 30 into the reaction chamber 4 through the vent hole 10.

A heater 40 is provided in the reaction chamber 4. The heater 40 is used to heat the substrate W. The heater 40 is provided in, for example, the hollow rotating body 30. The temperature of the substrate W which is being heated can be measured by, for example, a thermometer (not illustrated).

A reaction gas supply port 12 is provided on the reaction chamber 4. For example, as illustrated in FIG. 1, the reaction gas supply port 12 is provided above the support portion 34. A reaction gas is supplied from the reaction gas supply port 12 to the reaction chamber 4. Here, for example, the reaction gas passes through a shower plate 38, is supplied to the substrate W, and is used to form a film.

A rotating mechanism 26 is provided in the lower region 6. The rotating mechanism 26 rotates the rotating shaft 28 in a horizontal plane with respect to the direction of gravity to rotate the support portion 34 and the substrate W in the horizontal plane. Here, the rotating mechanism 26 is not particularly limited. For example, a motor is used. One example of rotating mechanism 26 includes a rotor 26a configured to transmit rotational motion to the rotating shaft 28, and a stator 26b disposed around the rotor 26a and configured to rotate the rotor 26a. It is preferable that the motor have a structure capable of preventing the supply of contaminants onto the substrate W. A motor which is molded with a resin is preferably used.

A first bearing 22 is provided in the lower region 6 and rotatably supports the rotating shaft 28. In addition, a second bearing 24 is provided below the first bearing 22 in the lower region 6 and rotatably supports the rotating shaft 28.

The structure of the first bearing 22 and the second bearing 24 is not particularly limited. However, for example, a rolling bearing includes an outer ring, an inner ring which is provided inside the outer ring, a plurality of rolling elements which are provided between the outer ring and the inner ring, a holder which holds the plurality of rolling elements. A known rolling element, such as a stainless steel ball, a SiN ball, or a cylindrical roller, is used as the rolling element. In addition, for example, grease having perfluoropolyether as a main component is used as a lubricant for a component forming the bearing.

A first air supply port 14 is provided above the rotating mechanism 26 and the first bearing 22 in the lower region 6. The first gas is supplied into the lower region 6 through the first air supply port 14.

A second air supply port 16 is provided below the rotating mechanism 26 and the second bearing 24 in the lower region 6. The second gas is supplied into the lower region 6 through the second air supply port 16.

For example, hydrogen ($H_2$) gas or nitrogen ($N_2$) gas is used as the first gas and the second gas. In particularly, it is preferable that hydrogen ($H_2$) gas be used as the first gas in order to cool a seal 36 which will be described below.

A first exhaust port 18 is provided between the first air supply port 14 and the second air supply port 16 in the lower region 6. The first gas, the second gas, and contaminants which are generated from the first bearing 22, the second bearing 24, and the rotating mechanism 26 are exhausted from the lower region 6 through the first exhaust port 18. Here, the first exhaust port 18 may be disposed between the first air supply port 14 and the second air supply port 16 in the direction of gravity. In addition, it is preferable that the sum of the flow rate of the first gas supplied from the first air supply port 14 and the flow rate of the second gas supplied from the second air supply port 16 be greater than the flow rate of the gas exhausted from the first exhaust port 18.

The first exhaust port 18 is preferably provided between the first bearing 22 and the second bearing 24 in order to exhaust the contaminants generated from the first bearing 22, the second bearing 24, and the rotating mechanism 26 with high efficiency.

A second exhaust port 20 is provided on the reaction chamber 4. For example, as illustrated in FIG. 1, the second exhaust port 20 is provided below the support portion 34. The first gas, the second gas, a surplus reaction gas, and a reaction by-product generated by the formation of a film are exhausted from the reaction chamber 4 through the second exhaust port 20. The number of second exhaust ports 20 is not particularly limited.

It is preferable that the seal 36 be provided between the reaction chamber 4 and the lower region 6. The seal 36 is provided around the rotating shaft 28 so as to be disposed above the rotating mechanism 26 and the first bearing 22 and below the support portion 34. At least one of the first gas and the second gas flows from the lower region 6 to the reaction chamber 4 through the seal 36. The type of the seal 36 is not particularly limited. For example, it is preferable to use a non-contact seal such as a labyrinth seal.

FIGS. 2A and 2B are diagrams schematically illustrating the vapor phase growth apparatus 2 according to this embodiment. FIG. 2A is a diagram illustrating an example of this embodiment. FIG. 2B is a diagram illustrating another example of this embodiment.

The vapor phase growth apparatus 2 further includes a flow rate control mechanism 60. The flow rate control mechanism 60 includes a first flow rate control unit 62, a second flow rate control unit 64, and an exhaust mechanism 66.

In the vapor phase growth apparatus 2 illustrated in FIG. 2A, gas exhausted from the first exhaust port 18 is supplied to the first flow rate control unit 62. In addition, gas exhausted from the second exhaust port 20 is supplied to the second flow rate control unit 64. Gas exhausted from the first flow rate control unit 62 and the second flow rate control unit 64 is exhausted by the exhaust mechanism 66.

The first flow rate control unit 62 controls the flow rate of the gas exhausted from the first exhaust port 18. The second flow rate control unit 64 controls the flow rate of the gas exhausted from the second exhaust port 20. The gas whose flow rate has been controlled by the first flow rate control unit 62 and the gas whose flow rate has been controlled by the second flow rate control unit 64 are exhausted by the exhaust mechanism 66.

In the vapor phase growth apparatus 2 illustrated in FIG. 2B, gas exhausted from the first exhaust port 18 is supplied to the first flow rate control unit 62. In addition, gas exhausted from the first flow rate control unit 62 and the second exhaust port 20 is supplied to the second flow rate control unit 64. Then, gas exhausted from the second flow rate control unit 64 is exhausted by the exhaust mechanism 66.

The first flow rate control unit 62 controls the flow rate of the gas exhausted from the first exhaust port 18. Then, the second flow rate control unit 64 controls the sum of the gas controlled by the first flow rate control unit 62 and the gas exhausted from the second exhaust port 20. Then, the gas whose flow rate has been controlled by the second flow rate control unit 64 is exhausted by the exhaust mechanism 66.

Here, the first flow rate control unit 62 and the second flow rate control unit 64 are not particularly limited. For example, a known mass flow controller, a needle valve, or a combination thereof is used. In addition, the exhaust mechanism 66 is not particularly limited. However, for example, a known dry pump is used.

In the vapor phase growth apparatus 2 illustrated in FIG. 2B, the flow rate of the gas exhausted from the first exhaust port 18 is controlled by both the first flow rate control unit 62 and the second flow rate control unit 64. Therefore, it is possible to prevent a large amount of gas from being exhausted from the first exhaust port 18, as compared to the vapor phase growth apparatus 2 illustrated in FIG. 2A.

Next, a vapor phase growth method according to this embodiment using the vapor phase growth apparatus 2 will be described with reference to FIG. 1 and FIGS. 2A and 2B.

First, for example, the substrate W is placed on the support portion 34 by a hand (not illustrated). Then, the rotating mechanism 26 is used to rotate the rotating shaft 28, thereby rotating the substrate W on the support portion 34 in the horizontal plane with respect to the direction of gravity. The rotational frequency is in the range of, for example, about 50 rpm to 3000 rpm. In addition, the substrate W is heated by the heater 40. When the temperature of the substrate W which is being heated is measured by a thermometer (not illustrated).

The reaction gas is supplied from the reaction gas supply port 12 to the reaction chamber 4. The supplied reaction gas is supplied onto the substrate W through the shower plate 38 and is used to form a film. A surplus reaction gas which has not been used to form the film or a reaction by-product generated by the formation of the film is exhausted from the second exhaust port 20.

The first gas is supplied to the first air supply port 14 and the second gas is supplied to the second air supply port 16. Then, the first gas and the second gas pass through the first bearing 22, the second bearing 24, or the rotating mechanism 26 and are then exhausted from the first exhaust port 18. In addition, contaminants which are generated from the first bearing 22, the second bearing 24, and the rotating mechanism 26 are exhausted through the first exhaust port 18. It is preferable that the sum of the flow rate of the first gas supplied from the first air supply port 14 and the flow rate of the second gas supplied from the second air supply port 16 is greater than the flow rate of the gas exhausted from the first exhaust port 18.

At least one of the first gas and the second gas is supplied from the lower region 6 to the reaction chamber through the seal 36.

In addition, at least one of the first gas and the second gas is supplied from the lower region 6 to the reaction chamber 4 through the hollow rotating shaft 28. The supplied gas purges contaminants around the heater 40, passes through the vent hole 10, and is exhausted from the second exhaust port 20.

The flow rate of the gas which has been exhausted from the first exhaust port 18 and the second exhaust port 20 is appropriately controlled by the first flow rate control unit 62 and the second flow rate control unit 64 and the gas is exhausted by the exhaust mechanism 66.

Next, the operation and effect of this embodiment will be described.

When the support portion 34 is rotated, dust or oil mist generated from materials forming the first bearing 22, the second bearing 24, and the rotating mechanism 26 is mixed as a contaminant with the film on the substrate. As a result, there is a concern that the quality of the film will deteriorate. When a substrate rotating portion is rotated at a high speed of 50 rpm to 3000 rpm, the amount of contaminants is particularly large.

In the vapor phase growth apparatus 2 according to this embodiment, the first air supply port 14 is provided above the first bearing 22, the second bearing 24, and the rotating mechanism 26 and the second air supply port 16 is provided below the first bearing 22, the second bearing 24, and the rotating mechanism 26. In addition, the first exhaust port 18 is provided between the first air supply port 14 and the second air supply port 16. Therefore, the contaminants are exhausted from the first exhaust port 18 by the first gas and the second gas, without reaching the vicinity of the substrate W. Therefore, it is possible to prevent the quality of the film from deteriorating.

The structure in which the rotating mechanism is provided between the first bearing 22 and the second bearing 24 makes it possible to stably absorb a load applied to, for example, the rotating shaft 28.

Since the vapor phase growth apparatus 2 includes the flow rate control mechanism 60, it is possible to control the amount of gas exhausted from the first exhaust port 18 and the second exhaust port 20 such that the mixture of the contaminants with the film is prevented and the reaction gas is prevented from getting into the first bearing 22, the second bearing 24, and the rotating mechanism 26.

The provision of the seal 36 makes it possible to prevent materials forming the first bearing 22, the second bearing 24, and the rotating mechanism 26 from being mixed with the film on the substrate. In addition, it is possible to prevent the reaction gas or the reaction by-product after the formation of the film from getting into the first bearing 22, the second bearing 24, and the rotating mechanism 26. Therefore, it is possible to increase the lifetime of the first bearing 22, the second bearing 24, and the rotating mechanism 26.

The rotating shaft 28 is hollow, has the vent hole 10, and has an opening portion at the lower end 32 of the rotating shaft, and the heater 40 is provided in the rotating shaft 28. According to this structure, gas supplied from the lower end 32 of the rotating shaft into the rotating shaft purges contaminants around the heater 40, passes through the vent hole 10, and is exhausted from the second exhaust port 20. Therefore, it is possible to suppress the influence of a process gas on the heater 40.

When the sum of the flow rate of the first gas supplied from the first air supply port 14 and the flow rate of the second gas supplied from the second air supply port 16 is greater than the flow rate of gas exhausted from the first exhaust port 18, it is possible to prevent the reaction gas from flowing around the first bearing 22, the second bearing 24, the rotating mechanism 26 through the seal 36. Therefore, it is possible to increase the lifetime of the first bearing 22, the second bearing 24, and the rotating mechanism 26. It is preferable that the flow rate control be performed by the flow rate control mechanism 60.

According to the above-mentioned structure, it is possible to provide a vapor phase growth apparatus and a vapor phase growth method which can prevent contaminants generated from a bearing or a rotating mechanism from being with a film and can form a high-quality film on a substrate.

The embodiments of the invention have been described above with reference to examples. The above-described embodiments are illustrative examples and do not limit the invention. In addition, the components according to each embodiment may be appropriately combined with each other.

In the above-described embodiments, the vertical single-wafer-type epitaxial apparatus which forms films on one wafer is given as an example. However, the vapor phase growth apparatus is not limited to the single-wafer-type epitaxial apparatus. For example, the invention can be applied to a horizontal epitaxial apparatus or a planetary CVD apparatus that simultaneously forms films on a plurality of wafers which revolve on their own axes and around the apparatus.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vapor phase growth apparatus comprising:
   a reaction chamber;
   a lower region provided below the reaction chamber;
   a rotating body provided in the reaction chamber;
   a rotating shaft connected to the rotating body and having a lower end provided in the lower region;
   a support portion provided in an upper portion of the rotating body and supporting a substrate;
   a reaction gas supply port provided on the reaction chamber and supplying a reaction gas for forming a film on the substrate into the reaction chamber;
   a rotating mechanism including a rotor, the rotating mechanism provided in the lower region and configured to rotate the rotating shaft;
   a first bearing provided in the lower region and rotatably supporting the rotating shaft;
   a second bearing provided below the first bearing in the lower region, the second bearing rotatably supporting the rotating shaft;
   a first air supply port provided above the rotating mechanism and the first bearing in the lower region, the first air supply port supplying a first gas into the lower region;
   a second air supply port provided below the rotating mechanism and the second bearing in the lower region, the second air supply port supplying a second gas into the lower region;
   a seal provided between the reaction chamber and the lower region, at least one of the first gas and the second gas flowing from the lower region to the reaction chamber through the seal;
   a first exhaust port provided between the first air supply port and the second air supply port in the lower region, the first exhaust port exhausting the first gas and the second gas from the lower region; and
   a second exhaust port provided in the reaction chamber and exhausting a surplus reaction gas and a reaction by-product generated by the formation of the film from the reaction chamber.

2. The vapor phase growth apparatus according to claim 1,
   wherein the rotating mechanism is provided between the first bearing and the second bearing.

3. The vapor phase growth apparatus according to claim 1,
   wherein the rotating shaft is hollow and has an opening portion provided at the lower end.

4. The vapor phase growth apparatus according to claim 1, further comprising:
   a flow rate control mechanism connected to the first exhaust port and the second exhaust port.

5. The vapor phase growth apparatus according to claim 4,
   wherein the flow rate control mechanism includes a first flow rate control unit, a second flow rate control unit, and an exhaust mechanism,
   the first gas and the second gas exhausted from the first exhaust port being supplied to the first flow rate control unit,
   the surplus reaction gas and the reaction by-product generated by the formation of the film being supplied to the second flow rate control unit, the surplus reaction gas and the reaction by-product being exhausted from the second exhaust port, and
   the first gas and the second gas exhausted from the first flow rate control unit and the surplus reaction gas and the reaction by-product generated by the formation of the film being exhausted by the exhaust mechanism, the surplus reaction gas and the reaction by-product being exhausted from the second flow rate control unit.

6. The vapor phase growth apparatus according to claim 4, wherein the flow rate control mechanism includes a first flow rate control unit, a second flow rate control unit, and an exhaust mechanism, the first gas and the second gas exhausted from the first exhaust port being supplied to the first flow rate control unit, the first gas and the second gas exhausted from the first flow rate control unit and the surplus reaction gas and the reaction by-product generated by the formation of the film being supplied to the second flow rate control unit, the surplus reaction gas and the reaction by-product being exhausted from the second exhaust port, and the first gas, the second gas, the surplus reaction gas, and the reaction by-product generated by the formation of the film being exhausted by the exhaust mechanism, the first gas, the second gas, the surplus reaction gas, and the reaction by-product being exhausted from the second flow rate control unit.

7. A vapor phase growth method comprising:

supporting a substrate with a support portion provided in an upper portion of a rotating body provided in a reaction chamber;

supplying a reaction gas for forming a film onto the substrate through a reaction gas supply port provided on the reaction chamber;

rotating a rotating shaft with a rotating mechanism including a rotor, the rotating shaft being connected to the rotating body, having a lower end provided in a lower region provided below the reaction chamber, and being rotatably supported by a first bearing provided in the lower region and a second bearing provided below the first bearing in the lower region;

supplying a first gas into the lower region through a first air supply port provided above the rotating mechanism and the first bearing in the lower region;

supplying a second gas into the lower region through a second air supply port provided below the rotating mechanism and the second bearing in the lower region;

flowing at least one of the first gas and the second gas from the lower region to the reaction chamber through a seal provided between the reaction chamber and the lower region;

exhausting the first gas and the second gas from a first exhaust port provided between the first air supply port and the second air supply port in the lower region; and exhausting a surplus reaction gas and a reaction by-product generated by the formation of the film from the reaction chamber.

8. The vapor phase growth method according to claim 7, wherein the sum of a flow rate of the first gas supplied from the first air supply port and a flow rate of the second gas supplied from the second air supply port is greater than a flow rate of the gas exhausted from the first exhaust port.

* * * * *